(12) United States Patent
Davidson et al.

(10) Patent No.: US 6,850,075 B1
(45) Date of Patent: Feb. 1, 2005

(54) SRAM SELF-TIMED WRITE STRESS TEST MODE

(75) Inventors: Colin Davidson, Basingstoke (GB); John Niven, Pleasanton, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 137 days.

(21) Appl. No.: 09/747,734

(22) Filed: Dec. 22, 2000

(51) Int. Cl.⁷ .............................................. H01H 31/02
(52) U.S. Cl. ...................... 324/537; 324/765; 324/158.1
(58) Field of Search ................. 324/537, 500, 324/617, 621, 73.1, 763, 765, 158.1

(56) References Cited

U.S. PATENT DOCUMENTS

| | | | |
|---|---|---|---|
| 4,961,053 A | * 10/1990 | Krug | 324/537 |
| 5,068,547 A | * 11/1991 | Gascoyne | 324/617 X |
| 5,161,161 A | * 11/1992 | Malek-Khosravi et al. | 371/28 |
| 5,457,400 A | * 10/1995 | Ahmad et al. | 324/763 |
| 5,838,163 A | * 11/1998 | Rostoker et al. | 324/763 |
| 6,118,138 A | * 9/2000 | Farnworth et al. | 257/48 |
| 6,181,163 B1 | * 1/2001 | Agrawal et al. | 326/41 |
| 6,275,962 B1 | * 8/2001 | Fuller et al. | 324/527 X |

* cited by examiner

Primary Examiner—N. Le
Assistant Examiner—Timothy J. Dole
(74) Attorney, Agent, or Firm—Christopher P. Maiorana, P.C.; Robert M. Miller (57) ABSTRACT

An integrated circuit includes a test circuit that may be configured to generate a test signal having a predetermined pulse width in response to a control input. The test signal may track process corners of the integrated circuit and may be used to predict a failure of the integrated circuit.

24 Claims, 9 Drawing Sheets

SRAM SELF-TIMED WRITE STRESS TEST MODE

FIELD OF THE INVENTION

The present invention relates to a method and/or architecture for testing memory devices generally and, more particularly, to a method and/or architecture for a static random access memory (SPAM) self-timed write stress test mode.

BACKGROUND OF THE INVENTION

Figure 1:
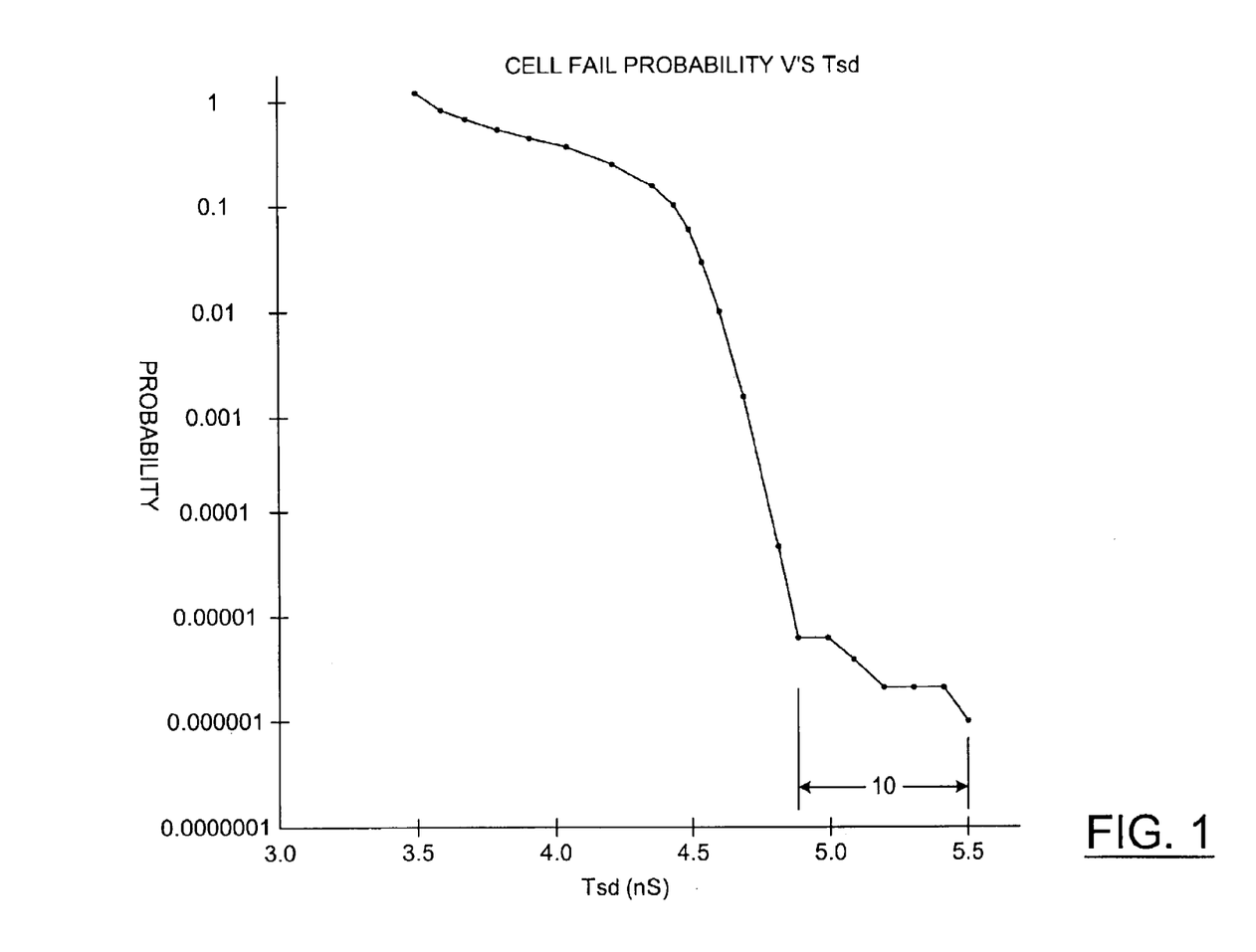
FIG. 1 is a graph comparing cell failure probability versus data setup to write end time.

Referring to FIG. 1, a graph of data setup to write end time (Tsd) vs. probability of cell failure of a static random access memory (SRAM) is shown. The graph was generated by counting the number of failing cells on a bitmap. A small number of SRAM cells can require a larger (but within spec) Tsd (e.g., region 10 of FIG. 1). The SRAM cells that require the larger Tsd can fail during life testing. The time until failure can be as long as 500 hours of life testing. The SRAM cells fail due to poor contacts in cross-coupled latch transistors. If the defective cells can be detected during sort, the cells can be repaired.

A problem with testing the SRAM cells is that the average Tsd performance for a given die can vary substantially with process. If the silicon is "slow," parts can be falsely rejected for having a large Tsd. Because of the variation, a tightly guardbanded test limit can result in a high yield loss. A more advanced and accurate tester is required to accurately define a narrow write enable pulse width that is varied depending on process corners. However, the testing of TSD timing cannot be performed at sort because testers that are accurate enough may not be available. Accurate testers can be made available, but historically have not been used to sort test because of cost issues. Even with an accurate tester, providing a variable test limit that tracks process variation is time consuming.

It would be desirable to have a device with a built-in self-timed test circuit that could compensate for process variation and predict cell failure prior to life testing of a given die.

SUMMARY OF THE INVENTION

The present invention concerns an integrated circuit comprising a test circuit that may be configured to generate a test signal having a predetermined pulse width in response to a control input. The test signal may track process corners of the integrated circuit and may be used to predict a failure of the integrated circuit.

The objects, features and advantages of the present invention include providing a SRAM self-timed write stress test mode that may (i) provide an on chip user programmable pulse generator to apply narrow write pulses; (ii) detect weak memory cells, (iii) adjust test mode pulse width from a default setting using fuses, (iv) fuse adjustable delay function removable to reduce ICC with 1 metal mask, (v) screen out failures prior to life testing, (vi) reduce test volume and cost, and/or (vii) provide a pulse width that tracks process corners.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 2:
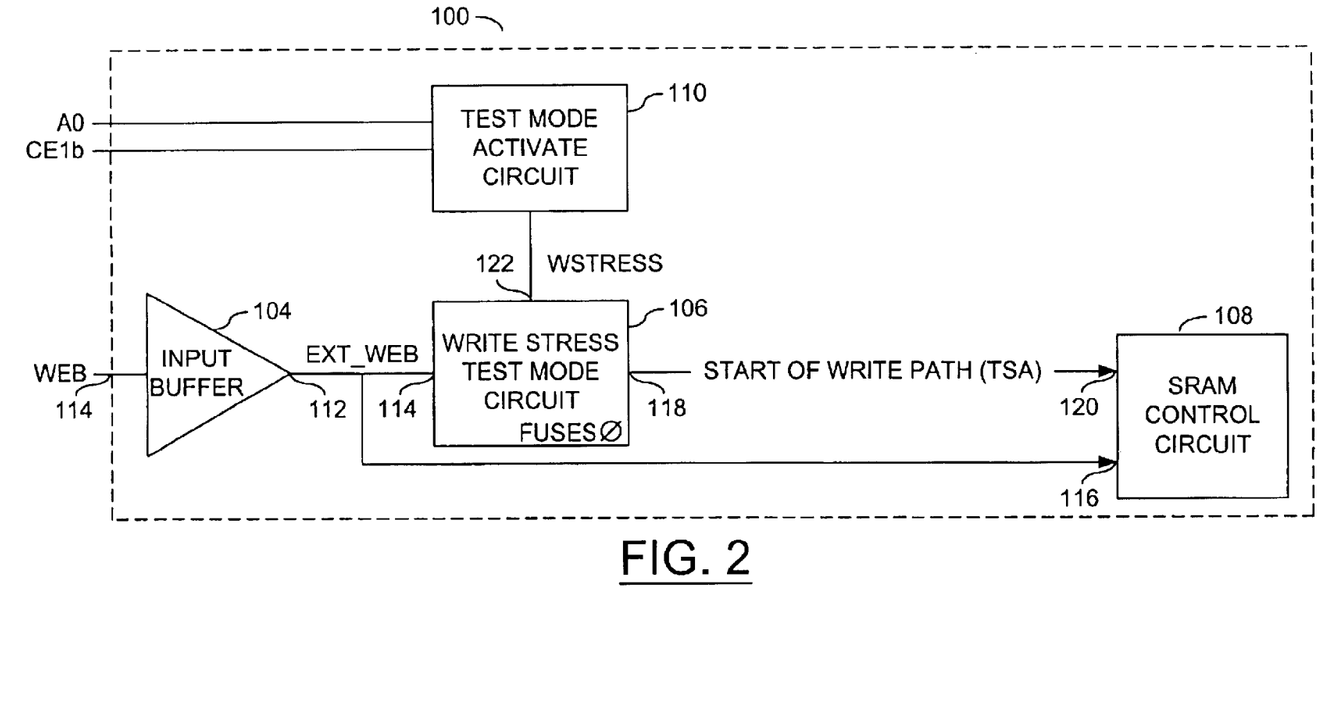
FIG. 2 is a block diagram of a preferred embodiment of the present invention.

Referring to FIG. 2, a block diagram of a circuit 100 illustrating a preferred embodiment of the present invention is shown. The circuit 100 may be a memory device. For example, the circuit 100 may be implemented as a static random access memory (SRAM). The circuit 100 may be configured to enter a test mode in response to one or more control inputs (e.g., address inputs, enable inputs, etc.). When the circuit 100 is in the test mode, a signal presented at an input 102 (e.g., WEB) may be used to test the operation and predict the failure of the circuit 100. The signal WEB may be a write enable signal. For example, the signal WEB may be used to detect particular memory cells that are slower (e.g., larger data setup to write end times) than other cells on a given die.

The circuit 100 may comprise a circuit 104, a circuit 106, a circuit 108 and a circuit 110. The circuit 104 may be implemented as an input buffer. The circuit 106 may be implemented as a write test mode circuit. The circuit 108 may be implemented, in one example, as a static random access memory (SRAM) control circuit. The circuit 110 may be implemented, in one example, as a test mode activation circuit. The signal WEB may be presented to an input of the circuit 104. The circuit 104 may have an output 112 that may present a signal (e.g., EXT_WEB) to an input 114 of the circuit 106 and an input 116 of the circuit 108. The circuit 106 may have an output 118 that may present a signal (e.g., INT_WE) to an input 120 of the circuit 108 and an input 122 that may receive a signal (e.g., WSTRESSB) from the circuit 110.

When the signal WSTRESSB is in a first (normal) state, the circuit 106 may be configured to present, in one example, a digital complement of the signal EXT_WEB as the signal INT_WE. Alternatively, the signal EXT_WEB may be presented as the signal INT_WE. When the signal WSTRESSB is in a second (test) state, the circuit 106 may be configured to present the signal INT_WE with a predetermined pulse width in response to an edge of the signal EXT_WEB. The circuit 106 may be implemented with a number of delay elements. The delay elements may be programmed either electrically or by fuses. However, other types of programming may be implemented to meet the design criteria of a particular application. The delay elements may be used to program the predetermined pulse width of the signal INT_WE. The signal INT_WE may be a self-timed write stress test signal that may be used to predict cell failures.

The circuit 110 may have an output that may present the signal WSTRESSB. The circuit 110 may be configured, in one example, to generate the signal WSTRESSB in response to one or more control signals. Alternatively, the circuit 110 may be configured to generate the signal WSTRESSB in response a predetermined sequence of events or criteria. In one example, the circuit 110 may be configured to generate the signal WSTRESSB in the test state in response to signal levels presented to one or more address and/or enable inputs of the circuit 100.

Figure 3:
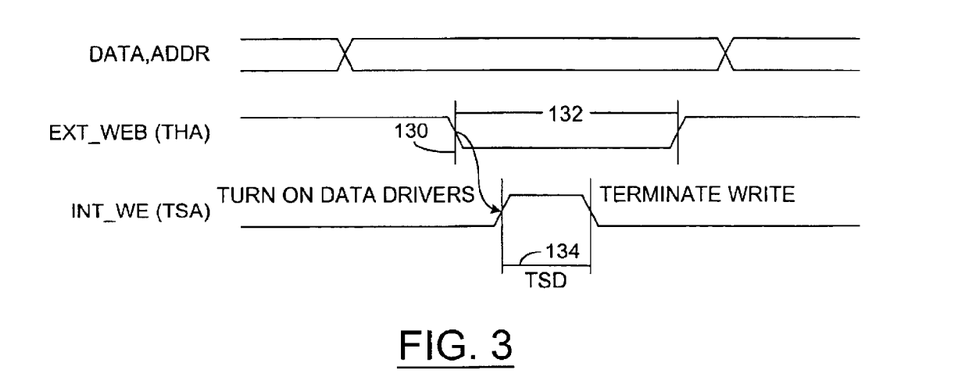
FIG. 3 is a timing diagram illustrating an implementation of a self-timed write test mode in accordance with the present invention.

Referring to FIG. 3, a timing diagram illustrating various signals of the circuit 100 of FIG. 2 is shown. In one example, the signal EXT_WEB may have a transition 130 from a HIGH level to a LOW level. In general, the transition will occur after the address and data signals are stable. The signal EXT_WEB may remain in the LOW state for a period of time 132. The duration of the period 132 is generally not critical. When the circuit 100 is in the test mode, the circuit 100 may be configured to generate the signal INT_WE in response to the transition 130 of the signal EXT_WEB. The signal INT_WE is generally asserted (e.g., a HIGH logic level) for a period of time 134. The period of time 134 may have a predetermined duration to meet criteria for testing the circuit 100. For example, the duration of the period 134 may be set to the Tsd for the circuit 100.

Figure 4:
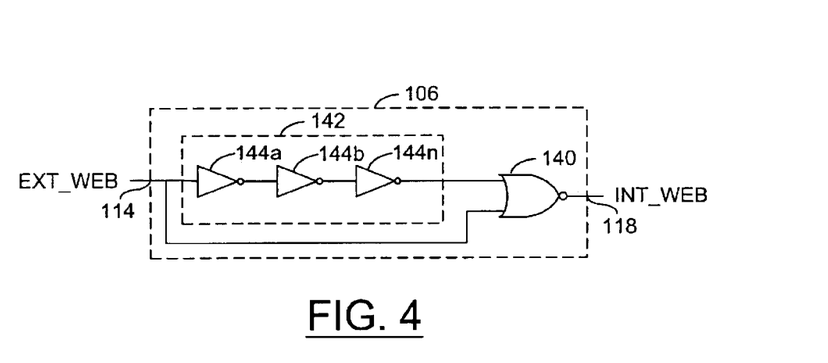
FIG. 4 is a block diagram illustrating a circuit implementation for generating a self-timed write test signal in accordance with the present invention.

Referring to FIG. 4, a block diagram illustrating an implementation of a circuit 106 for generating a self-timed write test signal in accordance with the present invention is shown. The circuit 106 may comprise, in one example, a gate 140 and a delay circuit (or block) 142. The gate 140 may be implemented in one example as a NOR gate. However, other types of gates may be implemented to meet the design criteria of a particular application. The signal EXT_WEB may be presented to a first input of the gate 140 and an input of the delay circuit 142. The delay circuit 142 may have an output that may present a signal to a second input of the gate 140. The signal INT_WE may be presented at an output of the gate 140.

The circuit 106 may be configured to generate the signal INT_WE as a pulse, having a pulse width determined by the delay circuit 142. The signal INT_WE may be generated in response to an edge of the signal EXT_WEB. Since the delay circuit 142 is fabricated on the chip (die), the pulse width of the signal INT_WE naturally tracks the process corners.

The circuit 142 may comprise a number of inverters 144a–144n connected in series. For example, the signal EXT_WEB may be presented to an input of the inverter 144a, an output of the inverter 144a may be connected to an input of the inverter 144b, etc. An output of the inverter 144n may be connected to the second input of the gate 140. The pulse width of the signal INT_WE may be determined by the number of inverters 144a–144n and the speed of the silicon (process corners).

Figure 5:
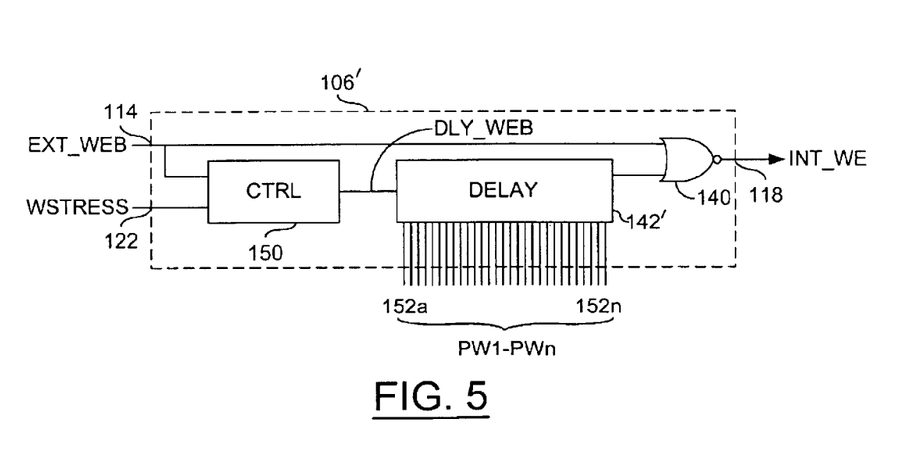
FIG. 5 is a detailed block diagram of a write stress test circuit of FIG. 2.

Referring to FIG. 5, a block diagram of a circuit 106' illustrating a preferred embodiment of the present invention is shown. The circuit 106' may comprise a gate 140, a delay circuit 142', and a control circuit (block) 150. The gate 140 may be implemented, in one example, as a NOR gate. However, other types of gates may be implemented accordingly to meet the design criteria of a particular application. The control circuit 150 may be implemented, in one example, as a NOR gate. However, other types of control or switching circuits may be implemented accordingly to meet the design criteria of a particular application. The circuit 142' may be implemented, in one example, as a non-inverting delay chain. However, other types of delay chains may be implemented to meet the design criteria of a particular application.

The signal EXT_WEB may be presented to a first input of the gate 140 and a first input of the circuit 150. The signal WSTRESSB may be presented to a second input of the circuit 150. The circuit 150 may have an output that may present a signal (e.g., DLY_WEB) to an input of the circuit 142'. The signal DLY_WEB may propagate through the circuit 142' in a predetermined amount of time. An output of the circuit 142' may be configured to present the signal DLY_WEB to a second input of the gate 140 after the predetermined amount of time. The circuit 142' may have a number of inputs 152a–152n that may receive a number of signals (e.g., PW1–PWn). The circuit 142' may be configured to determine the length of delay to generate in response to the signals PW1–PWn.

The signals PW1–PWn may be generated, in one example, in response to a state of a fusible element. Alternatively, the signals PW1–PWn may be generated in response to metal optioned elements, electrically programmable signals (e.g., a register file or nonvolatile memory), or any other appropriate elements or signals for programming a desired delay. In one example, a single metal mask may be used to program the signals PW1–PWn. In one example, each of the inputs 152a–152n may be configured to receive a complementary pair of signals (e.g., PW1 and PW1b, PWn and PWnb, etc.).

Figure 6:
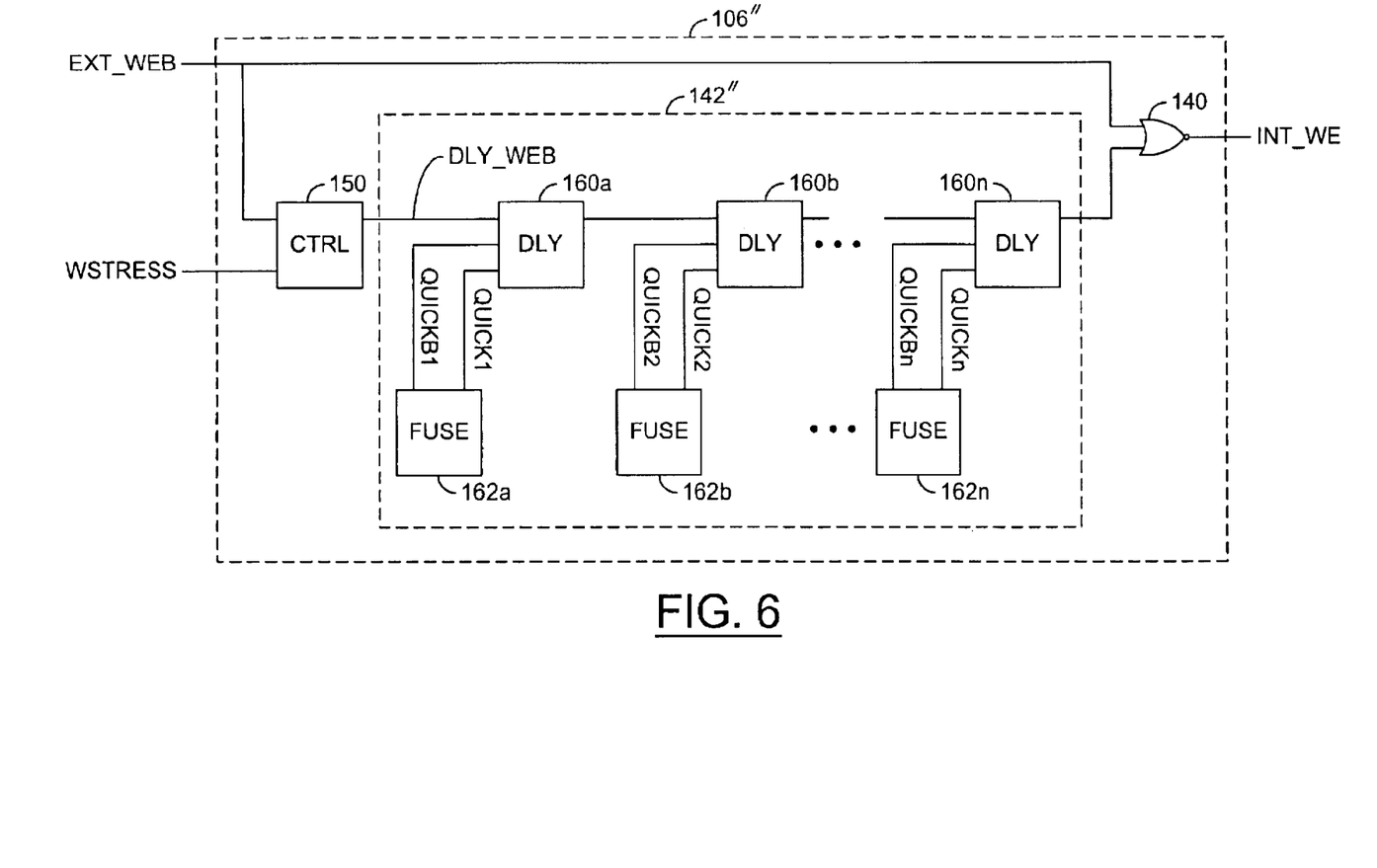
FIG. 6 is a more detailed block diagram of a write stress test circuit of FIG. 2.

Referring to FIG. 6, a detailed block diagram of a circuit 106" illustrating an alternative embodiment of the circuit 106 of FIG. 2 is shown. In one example, the circuit 106" may comprise a delay circuit 142". The circuit 142" may comprise a number of delay elements 160a–160n and a corresponding number of fuse elements (latches) 162a–162n.

The delay circuits 160a–160n may be connected in series (e.g., an output of the delay circuit 160a may be connected to an input of the circuit 160b, an output of the circuit 160b may be connected to an input of the circuit 160c, etc.). The signal DLY_WEB may be presented to an input of a first delay element (e.g., the circuit 160a). An output of a last delay element (e.g., the circuit 160n) may be connected to an input of the gate 140. Each of the delay circuits 160a–160n may be connected to a corresponding one of the fuse circuits 162a–162n. In one example, each of the fuse circuits 162a–162n may present a complementary pair of signals (e.g., QUICKB and QUICK) to a respective pair of inputs of each of the circuit 160a–160n. A state of each fuse element (e.g., blown or intact) may determine an amount of delay contributed by a corresponding delay element to the overall delay provided by the circuit 142".

Figure 7:
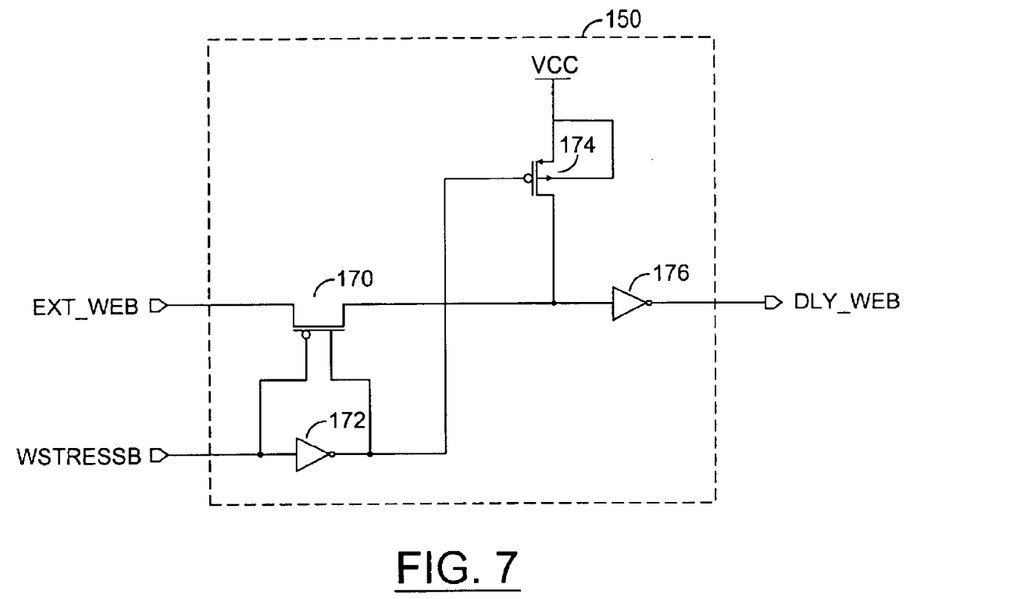
FIG. 7 is a block diagram of a control circuit of FIG. 6.

Referring to FIG. 7, a schematic diagram illustrating an implementation of the circuit 150 is shown. In one example, the circuit 150 may comprise a transistor 170, an inverter 172, a transistor 174 and an inverter 176. The transistor 170 may be implemented as a CMOS pass gate. The transistor 174 may be implemented as one or more PMOS transistors. However, other types of transistors may be implemented to meet the design criteria of a particular application. The signal EXT_WEB may be presented to an input of the pass gate 170. The signal WSTRESSB may be presented to an active LOW gate of the pass gate 170 and an input of inverter 172. An output of the inverter 172 may be presented to an active HIGH gate of the pass gate 170 and a gate of the transistor 174. An output of the pass gate 170 may be connected to a drain of the transistor 174 and an input of the inverter 176. A source of the transistor 174 may be connected to a supply voltage (e.g., VCC). The transistor 174 may have a substrate terminal that may be connected to the supply voltage VCC. An output of an inverter 176 may present the signal DLY_WEB. When the signal WSTRESSB is in a first (test) state (e.g., LOW) the circuit 150 may be configured to pass the signal EXT_WEB directly to the inverter 176 via the transmission gate 170. When the signal WSTRESSB is in a second (normal) state (e.g., HIGH), the circuit 150 may be configured to block the signal EXT_WEB and pull-up the input of the inverter 176 via transistor 174. When the signal WSTRESSB is HIGH, the transistor 174 generally ensures that the signal DLY_WEB generally remains LOW.

Figure 8:
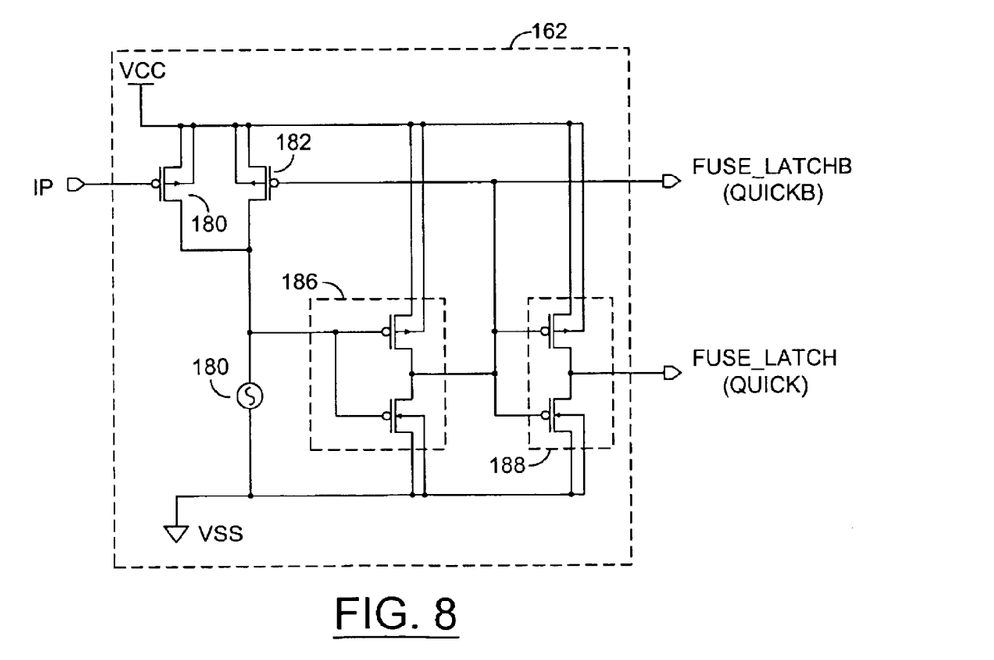
FIG. 8 is a schematic diagram of a fuse latch circuit of FIG. 6.

Referring to FIG. 8, a schematic diagram of a circuit 162 illustrating a fuse circuit in accordance with the present invention is shown. The circuit 162 may have an input that may receive a reset signal (e.g., IP), a first output that may present a signal (e.g., FUSE_LATCH) and a second output that may present a digital complement of the signal FUSE_LATCH (e.g., FUSE_LATCHB). The signals FUSE_LATCH and FUSE_LATCHB may be presented as the signals QUICK and QUICKB, respectively. The circuit 162 may comprise a transistor 180, a transistor 182, a fuse 184, a CMOS inverter 186 and a CMOS inverter 188. The signal IP may be presented to a gate of a transistor 180. A source of the transistor 180 and a source of the transistor 182 may be connected to the supply voltage VCC. A drain on the transistor 180 and a drain on the transistor 182 may be connected to a first terminal of the fuse 184 and an input of the inverter 186. A second terminal of the fuse 184 may be connected to a voltage supply ground VSS. A gate of the transistor 182 may be connected to an output of the inverter 186 and an input of the inverter 188. The signal FUSE_LATCHB may be presented at a node formed by the connection of the gate of the transistor 182, the output of the inverter 186, and the input of the inverter 188. The signal FUSE_LATCH may be presented at an output of the inverter 188.

Figure 9:
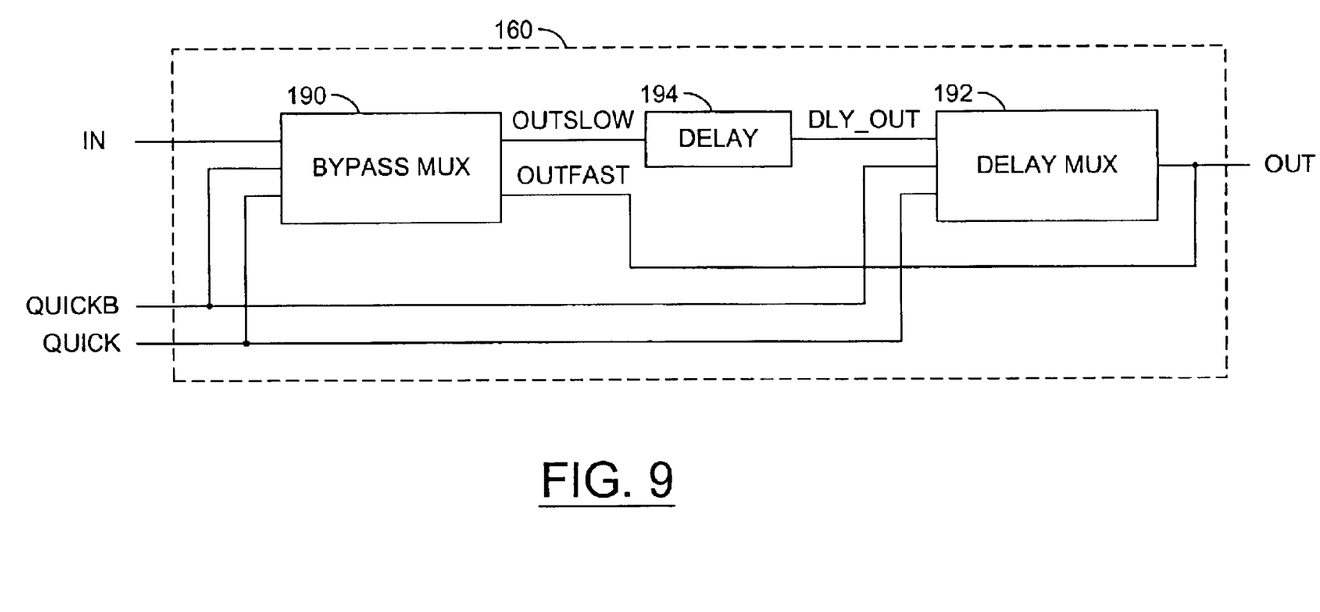
FIG. 9 is a detailed block diagram of a delay block of FIG. 6.

Referring to FIG. 9, a block diagram illustrating a preferred embodiment of a circuit 160 of FIG. 6 is shown. The circuit 160 may comprise a circuit 190, a circuit 192 and a circuit 194. The circuit 190 may be implemented as a bypass multiplexer circuit. The circuit 192 may be implemented as a delay multiplexer circuit. The circuit 194 may be implemented as a delay circuit (block). The input to the circuit 160 may be presented to an input of the circuit 190. The signals QUICKB and QUICK may be presented to a first and a second input of the circuits 190 and 192, respectively. A first output of the circuit 190 may be connected to an output of the circuit 192 and the output of the circuit 160. A signal (e.g., OUTFAST) may be presented at the first output of the circuit 190. A second output in circuit 190 may present a signal (e.g., OUTSLOW) to an input of the circuit 194. An output of the circuit 194 may present a signal (e.g., DLY_OUT) to a third input of the circuit 192.

In general, the circuit 160 may provide a short or a long delay depending on the relative values of the signals QUICKB and QUICK. For example, when the signals QUICKB and QUICK are in a first state, the input to the circuit 160 may be passed quickly to the output of the circuit 160. The output of the delay multiplexer 192 may be tri-stated and the signal OUTFAST presented as the signal OUT. When the signals QUICKB and QUICK are in a second state, the input to the circuit 160 may be delayed via the circuit 194 before being presented at the output for the circuit 160. The signal OUTFAST may be tri-stated and the signal DLY_OUT present as the signal OUT.

Figure 10:
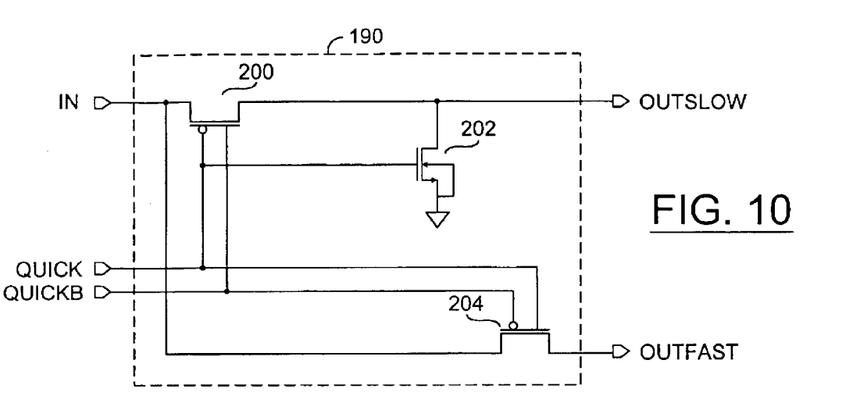
FIG. 10 is a schematic diagram of a bypass multiplexer circuit of FIG. 9.

Referring to FIG. 10, a schematic diagram of illustrating a preferred embodiment of a circuit 190 of FIG. 9 is shown. The circuit 190 may comprise a transistor 200, a transistor 202 and a transistor 204. The transistor 200 and the transistor 204 may be implemented as CMOS pass gates. The transistor 202 may be implemented as one or more NMOS transistors. However, other types of transistors may be implemented to meet the design criteria of a particular application. An input to the circuit 190 (e.g., IN) may be presented to an input of the pass gate 200 and an input of the pass gate 204. The signal QUICK may be presented to an active low gate of the pass gate 200, a gate of the transistor 202 and an active high gate of the pass gate 204. The signal QUICKB may be presented to an active high gate of the pass gate 200 and an active low gate of the pass gate 204. A source of the transistor 202 may be connected to a ground potential VSS. A substrate terminal of the transistor 202 may also be connected to the ground potential VSS. A drain of the transistor 202 may be connected to an output of the pass gate 200. The signal OUTSLOW may be presented at a node formed by the connection of the output of the pass gate 200 and the drain of the transistor 202. The signal OUTFAST may be presented at an output of the pass gate 204.

Figure 11:
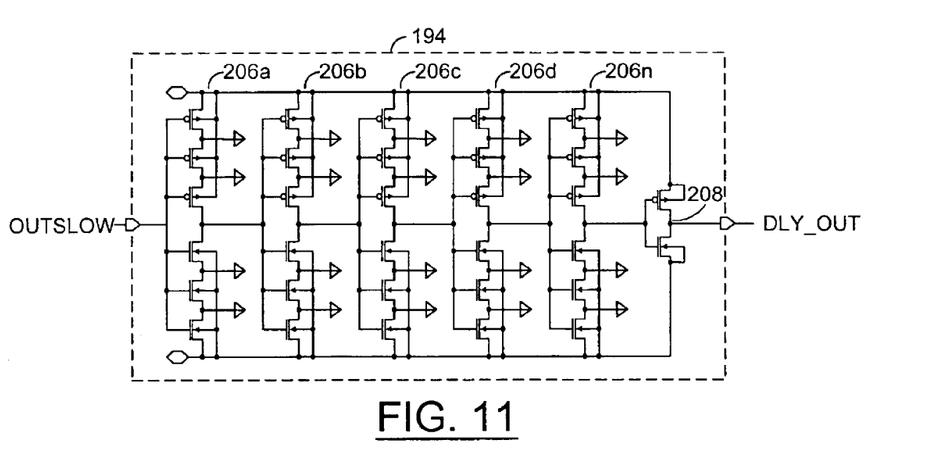
FIG. 11 is a schematic diagram of a delay circuit of FIG. 9.

Referring to FIG. 11, a schematic diagram illustrating a preferred embodiment of a circuit 194 of FIG. 9 is shown. The circuit 194 may comprise a number of delay stages 206a–206n and an output stage 208. The delay stages 206a–206n may be implemented using complementary MOS transistor pairs. The signal OUTSLOW may be presented to the first stage 206a. The signal DLY_OUT may be presented at an output of the output stage 208. The stages of the circuit 194 are generally connected in series. A particular delay duration may be determined by the number of stages 206a–206n and the speed of the silicon (process corners).

Figure 12:
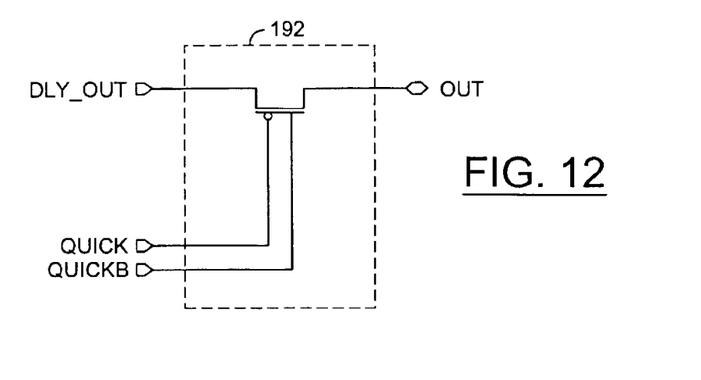
FIG. 12 is a schematic diagram of a delay multiplexer circuit of FIG. 9.

Referring to FIG. 12, a schematic diagram illustrating an implementation of the circuit 192 of FIG. 9 is shown. The circuit 192 may be implemented as a CMOS pass gate. The signal DLY_OUT may be presented to an input of the pass gate. The signal OUT may be presented at an output of the pass gate. The signals QUICKB and QUICK may be presented to control gates of the pass gate.

Figure 13:
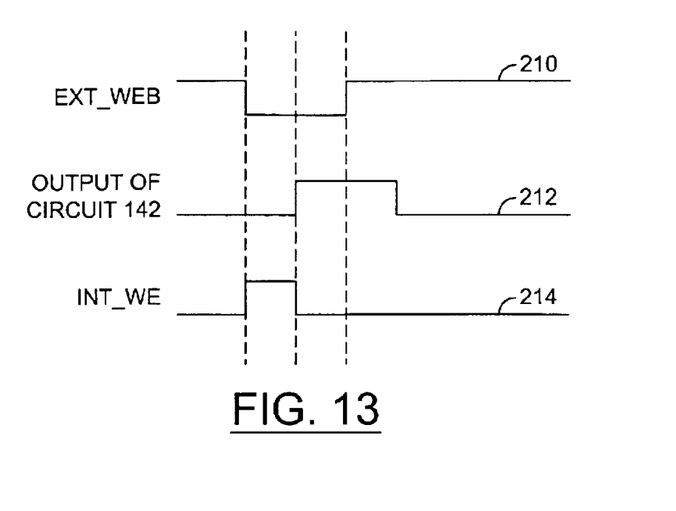
FIG. 13 is a timing diagram illustrating an example operation of the present invention.

Referring to FIG. 13, a timing diagram illustrating various signals of the present invention is shown. A trace 210 illustrates an example of the signal EXT_WEB presented to a first input of the gate 140. A trace 212 illustrates an example of the signal presented by the delay circuit 142 to the second input of the gate 140. A trace 214 illustrates an example of the signal INT_WE presented at the output of the gate 140.

Figure 14:
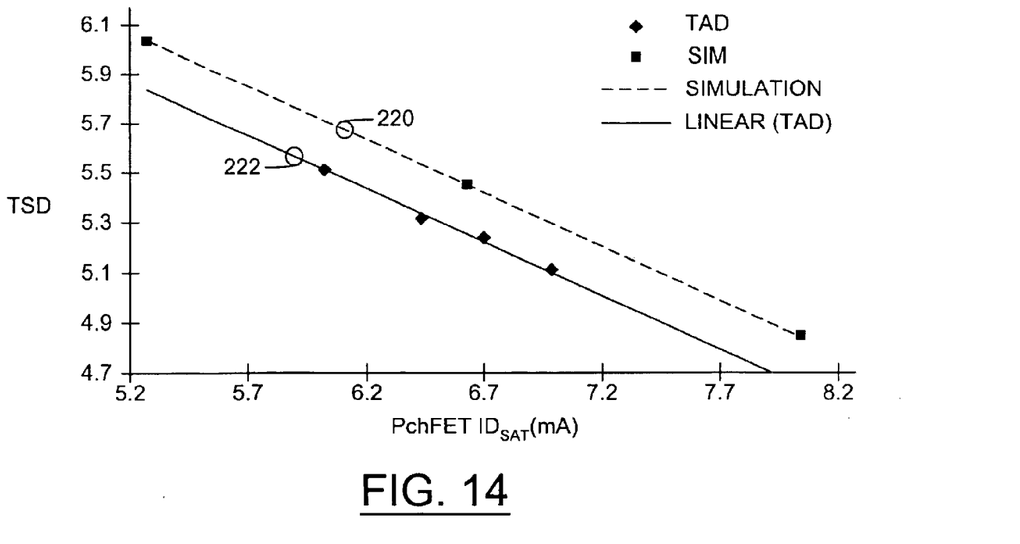
FIG. 14 is a graph illustrating a relationship between data setup time and p-channel FET Idsat current.

Referring to FIG. 14, a graph of data setup to write end time (Tsd) versus p-channel FET Idsat current is shown. In general, the Tsd of a particular part decreases as the Idsat current increases. The measured p-channel FET Idsat current represents variation in the process corners. The simulation trace 220 represents the results of simulating a write pulse as generated by the self-timed write stress test circuit 100 for various values of Idsat. In general, there is a constant offset between the normal value of Tsd (e.g., trace 222) and the test conditions generated by the circuit 100. Any cell or group of cells that has a Tsd that is slower than normal by more than the offset will generally be detected, and failed.

Since the Tsd is generally related to the Idsat current, the delay generated by the circuit 142 generally tracks the complex delays involved in the Tsd. When an appropriate delay for the circuit 142 is determined in a test part, similar programming (e.g., fuses, metal options, etc.) may be relied upon to generate the signal INT_WE to track the Tsd over process corners in other parts.

Figure 15:
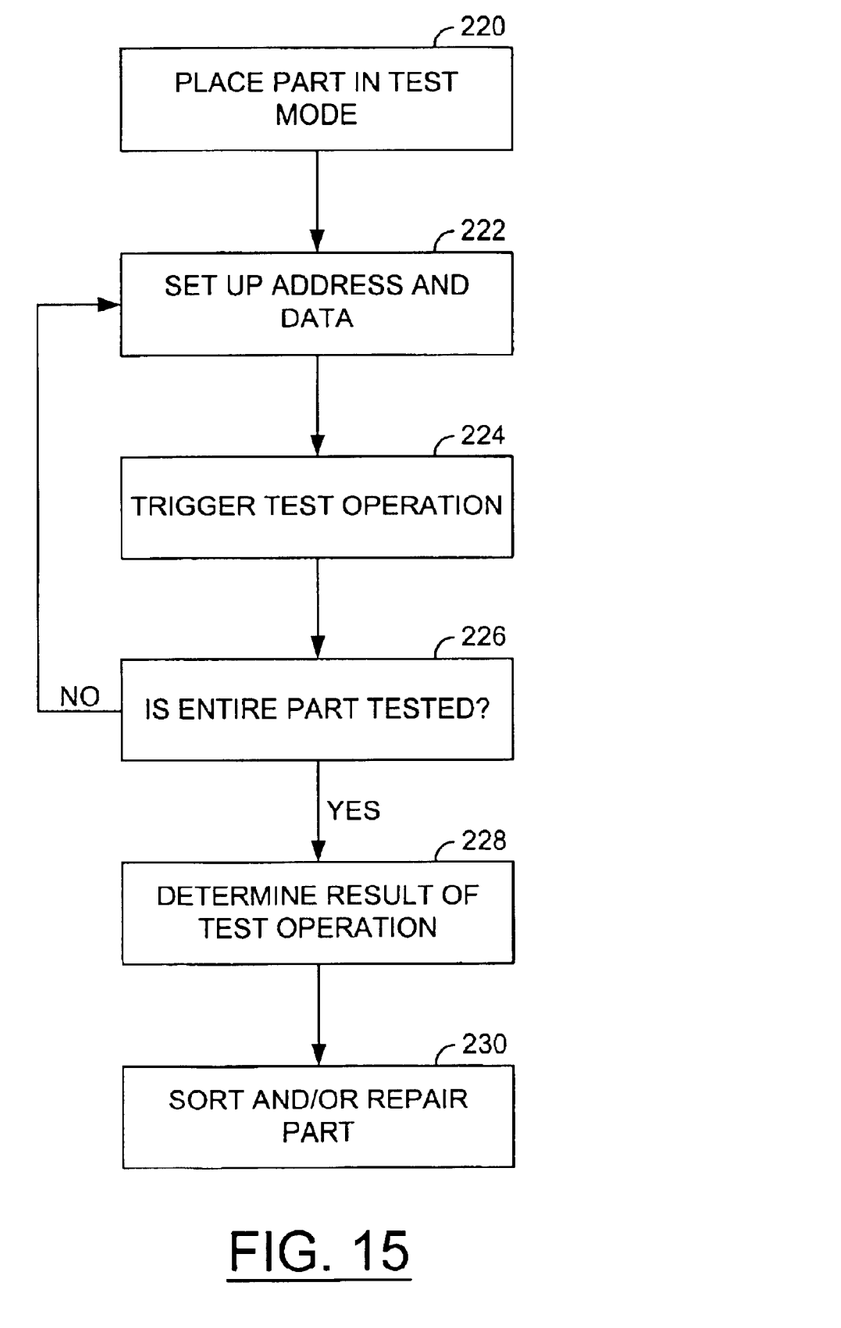
FIG. 15 is a flow diagram illustrating an example test procedure in accordance with a preferred embodiment of the present invention.

Referring to FIG. 15, a flow diagram illustrating an example testing operation in accordance with the present invention is shown. In one example, a write stress test mode may be entered using the following steps:

1) Place chip in test mode (e.g., block 220). In one example, a test mode may be initiated with the following sub-steps:
   a) Apply a high voltage to an address pin (e.g., A0).
   b) Apply a high voltage to an enable pin (e.g., CE1B).
   c) Remove the high voltage from the address pin (the pin may then be used as in normal chip operation) and maintain high voltage on the enable pin.
4) Set up address and data (e.g., block 222).
5) Trigger a test operation (e.g., block 224). For example, apply a high to low edge on the WEB pin. The pulse generation circuit detects the high to low edge and produces an internal WEB pulse. All addresses in the memory array may be accessed.
6) Exit the test mode when chip test is completed (e.g., block 226). For example, the high voltage may be removed from the enable pin (e.g., set CE1B to 0 volts).
7) Determine the result of the test (e.g., block 228). For example, read from all addresses and check whether all addresses were written to.
8) Sort parts where data was not written for repair (e.g., block 230).

The high voltage may be, in one example, up to 9.6 volts for 5 volt parts, depending on what high voltage test mode entry circuit is selected. The fuses may be implemented as laser programmable. In one example, fuses may be successively blown to increase or decrease the pulse width. While the write stress test mode may be available on a packaged part, once the part is packaged, the pulse width generally cannot be changed. However, fuses may be provided to disable the test mode in a package device if necessary.

The write stress test mode may be used to screen for defective devices prior to life testing. The test mode may comprise write operations using a narrow (user definable) write pulse to all addresses. Prior to life testing, a read may be performed on all address locations to detect any failures.

The write pulse may be generated on chip to eliminate a need for more complex test equipment. Since the write pulse is generated on-chip, the pulse width generally tracks the process corners. Screening out failures prior to life testing may reduce test volume and cost.

The present invention may provide a test circuit that is self-adjusting because the test circuit is on-chip. The test circuit may be configured to generate a worst case Tsd pulse width. The pulse width may be programmed using fuses or other appropriate configuration circuits. In one example, a test operation may comprise 1) placing a chip in a test mode, 2) sending WEB edge, 3) writing to memory cells using a narrow width pulse, 4) reading from the memory cells in a normal mode, and 5) determining whether any memory cells failed to write data.

The present invention may provide an address transition detect (ATD) type of circuit to generate a write pulse of controlled width. The pulse generation may be done in a test mode, such that the tester need only provide a "start" trigger. The on-chip circuit may be configured to terminate the write operation automatically. The pulse width may naturally track the "speed" of the die.

The present invention may provide an on-chip, user definable width, WEB pulse generator for applying narrow write pulses and detecting weak memory cells on subsequent reads. Fuses may be used to adjust the test mode WEB pulse width from a default setting. Test engineering may set the delay based on bench measurements. The fuse adjustable delay function may be removed to adjust (reduce) current (e.g., ICC) with 1 metal mask step. Once a die is packaged, programming of fuses may not be possible. However, a fuse may be provided for disabling the test mode after packaging.

The circuit 100 may provide a programmable write pulse that varies over process/conditions in a similar direction as Tsd. A Tsd may be determined using simulation. The circuit 100 may be set (blow fuses) by trial and error experiments with real silicon to get approximately the desired Tsd(min) plus a delta value. When a satisfactory setting is found, the setting may be hardcoded in a metal mask to eliminate the need for blowing fuses and reduce ICC current.

While the invention has been particularly shown and described with reference to the preferred embodiments thereof, it will be understood by those skilled in the art that various changes in form and details may be made without departing from the spirit and scope of the invention.

What is claimed is:

1. An integrated circuit comprising:
   a test circuit configured to generate an internal control signal in response to a control input, wherein (a) said internal control signal has (i) a first pulse width when a test mode is enabled and (ii) a second pulse width when said test mode is not enabled, (b) said first pulse width is determined in response to one or more tracks process corners and a predetermined pulse width correlating with a probability of a physical failure of said integrated circuit occurring at a future time and (c) said second pulse width is determined in response to said control input.

2. The integrated circuit according to claim 1, wherein said control input comprises a write enable input.

3. The integrated circuit according to claim 2, wherein said control input comprises a transition of a write enable input.

4. The integrated circuit according to claim 3, wherein said transition is from a HIGH logic level to a LOW logic level.

5. The integrated circuit according to claim 1, wherein said first pulse width is user definable.

6. The integrated circuit according to claim 5, wherein said first pulse width is determined in response to one or more configuration inputs.

7. The integrated circuit according to claim 6, wherein said configuration inputs are fuse programmable.

8. The integrated circuit according to claim 6, wherein said configuration inputs are determined by a metal masking step during fabrication.

9. The integrated circuit according to claim 1, wherein said integrated circuit comprises a static random access memory.

10. The integrated circuit according to claim 1, wherein said physical failure of said integrated circuit occurs in one or more memory cells during life testing.

11. The integrated circuit according to claim 1, wherein said test circuit is further configured (i) to generate present said internal control signal to a start of a write path of said integrated circuit and (ii) to pass present said control input to an end of said write path.

12. The integrated circuit according to claim 11, wherein said test circuit is further configured to enter said test mode in response to a predetermined sequence of input signals.

13. The integrated circuit according to claim 1, wherein said test circuit comprises:

a first circuit configured to generate said internal control signal in response to said control input and a mode control signals; and a second circuit configured to generate said mode control signal in response to a plurality of input signals.

14. The apparatus according to claim 1, wherein said physical failure is independent of said internal control signal.

15. An integrated circuit comprising:

means for generating an internal control signal having in response to a first control input, wherein (a) said internal control signal has (i) a first pulse width when in a test mode and (ii) a second pulse width when not in said test mode, (b) said first pulse width is determined in response to one or more process corners and a predetermined pulse width correlating with a probability of a physical failure in said integrated circuit occurring at a future time and (c) said second pulse width is determined in response to said first control input; and means for enabling said test mode in response to one or more second control inputs.

16. A method for sorting integrated circuits prior to life testing comprising the steps of:

(A) placing said integrated circuit in a test mode; and (B) measuring a result of an operation of said integrated circuit performed in response to an internal control signal generated on said integrated circuit in response to a control input, wherein (a) said internal control signal has (i) a first pulse width when in said test mode and (ii) a second pulse width when not in said test mode, (b) said first pulse width is determined in response to one or more process corners and a predetermined pulse width correlating with a probability of a physical failure in said integrated circuit occurring at a future time during said life testing and (c) said second pulse width is determined in response to said control input.

17. The method according to claim 16, wherein said operation comprises a write operation.

18. The method according to claim 16, wherein said internal control signal is a write pulse presented to a start of a write path of said integrated circuit.

19. The method according to claim 18, wherein said write pulse has a pulse width determined by a data setup to write end time of the integrated circuit.

20. The method according to claim 16, wherein are said measurement is performed prior to said life testing.

21. The method according to claim 16, further comprising the step of:

sorting said integrated circuits in response to a failure of said operation.

22. The method according to claim 21, further comprising the step of:

repairing said integrated circuit prior to said life testing.

23. The method according to claim 16, wherein:

said operation comprises writing to a memory cell; and said physical failure of said integrated circuit is related to a poor contact in cross-coupled latch transistors of said memory cell.

24. The method according to claim 16, wherein placing said integrated circuit in said test mode further comprises the steps of:

applying a first high voltage to an address pin of said integrated circuit;

applying a second high voltage to an enable pin of said integrated circuit; and removing said first high voltage from said address pin.

* * * * *